(12) United States Patent
Sasaki et al.

(10) Patent No.: US 7,459,884 B2
(45) Date of Patent: Dec. 2, 2008

(54) REMAINING CAPACITY CALCULATION METHOD FOR SECONDARY BATTERY, AND BATTERY PACK

(75) Inventors: Taichi Sasaki, Fukushima (JP); Masaki Hogari, Fukushima (JP)

(73) Assignee: Sony Corporation, Tokyo (JP)

( * ) Notice: Subject to any disclaimer, the term of this patent is extended or adjusted under 35 U.S.C. 154(b) by 177 days.

(21) Appl. No.: 11/104,697

(22) Filed: Apr. 13, 2005

(65) Prior Publication Data

US 2005/0237027 A1 Oct. 27, 2005

(30) Foreign Application Priority Data

Apr. 27, 2004 (JP) ............................ P2004-130779

(51) Int. Cl.
*H02J 7/00* (2006.01)
(52) U.S. Cl. ...................................... 320/132; 324/427
(58) Field of Classification Search .................. 320/130, 320/132, DIG. 21; 324/427, 428, 429, 430, 324/432, 433
See application file for complete search history.

(56) References Cited

U.S. PATENT DOCUMENTS

| | | | | |
|---|---|---|---|---|
| 5,164,761 A | * | 11/1992 | Isono et al. | 396/279 |
| 5,545,969 A | * | 8/1996 | Hasegawa | 320/134 |
| 5,592,094 A | * | 1/1997 | Ichikawa | 324/427 |
| 5,617,324 A | * | 4/1997 | Arai | 702/63 |
| 5,703,486 A | * | 12/1997 | Arai et al. | 324/427 |
| 5,744,963 A | * | 4/1998 | Arai et al. | 324/427 |
| 5,963,016 A | * | 10/1999 | Arai et al. | 320/132 |
| 6,008,626 A | * | 12/1999 | Sato et al. | 320/132 |
| 6,107,779 A | * | 8/2000 | Hara et al. | 320/132 |
| 6,157,169 A | * | 12/2000 | Lee | 320/132 |
| 6,262,577 B1 | * | 7/2001 | Nakao et al. | 324/425 |
| 6,369,547 B2 | * | 4/2002 | Suzuki et al. | 320/132 |
| 6,515,452 B2 | * | 2/2003 | Choo | 320/132 |
| 6,845,332 B2 | * | 1/2005 | Teruo | 702/63 |
| 6,972,545 B2 | * | 12/2005 | Tsuchiya et al. | 320/132 |
| 7,136,762 B2 | * | 11/2006 | Ono | 702/63 |
| 2001/0054879 A1 | * | 12/2001 | Okada et al. | 320/132 |

(Continued)

FOREIGN PATENT DOCUMENTS

JP 07-198807 1/1995

(Continued)

OTHER PUBLICATIONS

Japanese Office Action dated Jul. 24, 2007.

*Primary Examiner*—Akm E Ullah
*Assistant Examiner*—M'Baye Diao
(74) *Attorney, Agent, or Firm*—Bell, Boyd & Lloyd LLP (57) ABSTRACT

A remaining capacity calculation method for a secondary battery and a battery pack are provided. Dischargeable electric power is accurately calculated and accuracy of a remaining capacity rate found by an electric power integration method may be improved by providing a remaining capacity calculation method for a secondary battery. The method includes calculating a consumed electric power by way of integration of voltage and current measured at a preset time interval when using the secondary battery; calculating an available dischargeable electric power by subtracting an energy loss and unavailable energy from a discharge electric power of the secondary battery; and calculating a remaining capacity rate from a ratio between the calculated electric power and the dischargeable electric power.

1 Claim, 5 Drawing Sheets

U.S. PATENT DOCUMENTS

2004/0090207 A1* 5/2004 Ooi et al. .................... 320/132
2004/0257044 A1* 12/2004 Nagaoka .................... 320/132

FOREIGN PATENT DOCUMENTS

| JP | 7198807 | 8/1995 |
| JP | 08-075833 | 3/1996 |
| JP | 08-201488 | 8/1996 |
| JP | 09-070146 | 3/1997 |
| JP | 10-108301 | 4/1998 |
| JP | 11-008940 | 1/1999 |
| JP | 11-038107 | 2/1999 |
| JP | 2003-194897 | 7/2003 |
| JP | 2003-207552 | 7/2003 |
| JP | 2004-045375 | 2/2004 |
| JP | 2004130779 | 4/2004 |

\* cited by examiner

|  | | INTEGRATED VALUE : |
|---|---|---|
| FIRST TIME | 170/5.208=32 (SURPLUS 3) | 32 |
| SECOND TIME | (170+3)/5.208=33 (SURPLUS 1) | 65 |
| THIRD TIME | (170+1)/5.208=33 (SURPLUS 4) | 97 |
| FOURTH TIME | (170+4)/5.208=33 (SURPLUS 2) | 130 |
| FIFTH TIME | (170+2)/5.208=33 (SURPLUS 0) | 163 |
| SIXTH TIME | (170+0)/5.208=33 (SURPLUS 3) | 195 |
| SEVENTH TIME | (170+3)/5.208=33 (SURPLUS 1) | 228 |
| EIGHTH TIME | (170+1)/5.208=33 (SURPLUS 4) | 260 |
| NINTH TIME | (170+4)/5.208=33 (SURPLUS 2) | 293 |
| TENTH TIME | (170+2)/5.208=33 (SURPLUS 0) | 326 | ns
REMAINING CAPACITY CALCULATION METHOD FOR SECONDARY BATTERY, AND BATTERY PACK

CROSS REFERENCE TO RELATED APPLICATIONS

The present application is based on Japanese Patent Application No. P2004-130779, filed to the Japanese Patent Office on Apr. 27, 2004, the contents of which being incorporated herein by reference.

BACKGROUND OF THE INVENTION

The present invention relates to a remaining capacity calculation method for a secondary battery, and a battery pack.

A battery pack containing a plurality of secondary batteries is used in various electric devices, and it is widely known that the bodies of the electric devices are arranged so as to notify a user of a remaining capacity of the battery pack by blinking or pulsing light from light emitting diodes and the like. In the case of camcorders (Camcorder: abbreviation for Camera and recorder) for broadcasting stations, for example, their business application require that the remaining capacity be displayed or notified with certain accuracy.

As a method of detecting a charge capacity of the secondary battery, an integration method of obtaining the charge capacity by integrating current or electric power is known. When using the secondary battery (at time of charging, discharging), the voltage and current at that time are measured, and the electric power used is integrated by way of voltage multiplied by current. The remaining capacity rate of the secondary battery is then calculated by obtaining a ratio between the integrated electric power and the dischargeable electric power of the secondary battery.

Japanese Laid-Open Patent Application No. 7-198807 discloses that a battery remaining capacity is calculated based on consumed current of the battery and a temperature of the battery.

However, a disadvantage of the electric power integration method by an integration method is that the error of the remaining capacity calculation is large during a discharge termination phase (final stage of discharge). For example, the electric device may be used even if a remaining capacity is shown as 0%, and even if the remaining capacity is shown as 5%, there is a possibility that the electric device is not available for use. This may constitute a considerably disadvantage for a professional device.

The fact that the remaining capacity calculation error at the final stage of discharge is magnified because of accumulation of measurement errors, generation of reactive electric power due to heat loss and the like, and loss of effective electric power due to a DC impedance (hereinafter simply referred to as DC-Imp) rise of the secondary battery. In the electric power integration method, the integration of the electric power is carried out, with the result that all types of errors are also integrated, so that the error at the final stage of discharge is magnified. In the above-mentioned Japanese Laid-Open Patent Application No. 7-198807, it is difficult to take into account the fact that the error is magnified at the final stage of discharge.

SUMMARY OF THE INVENTION

The present invention in an embodiment provides a remaining capacity calculation method for a secondary battery and a battery pack which can calculate the dischargeable electric power according to environments such as a load, a temperature, and which can lessen the error at the final stage of discharge.

A preferred embodiment of the present invention provides a remaining capacity calculation method for a secondary battery, in which a voltage and current when using the secondary battery are measured at predetermined time interval, and the electric power used is integrated by way of a product of the voltage and the current; available dischargeable electric power for use is obtained by subtracting an energy loss and unavailable energy from the discharge electric power of the secondary battery, and a remaining capacity rate is obtained from a ratio between the integrated electric power and the dischargeable electric power.

Further, another preferred embodiment of the present invention provides a battery pack of a secondary battery, in which the battery pack includes a measurement unit for measuring a voltage and current of the secondary battery and a remaining capacity calculation unit; the remaining capacity calculation unit measures the voltage and current when using the secondary battery at predetermined time interval; the electric power used is integrated by a product of the voltage and the current; finds dischargeable electric power which can be used, by subtracting an energy loss and unavailable energy from the discharge electric power of the secondary battery, and calculates a remaining capacity rate from a ratio between the integrated electric power and the dischargeable electric power.

According to the preferred embodiments of the present invention, even with the remaining capacity calculation method by way of the electric power integration method, it is possible to accurately calculate the dischargeable electric power, so that the remaining capacity at the final stage of discharge can be calculated more accurately.

Additional features and advantages of the present invention are described in, and will be apparent from, the following Detailed Description of the Invention and the figures.

DETAILED DESCRIPTION OF THE INVENTION

The present invention relates to a remaining capacity calculation method for a secondary battery, and a battery pack.

Figure 1:
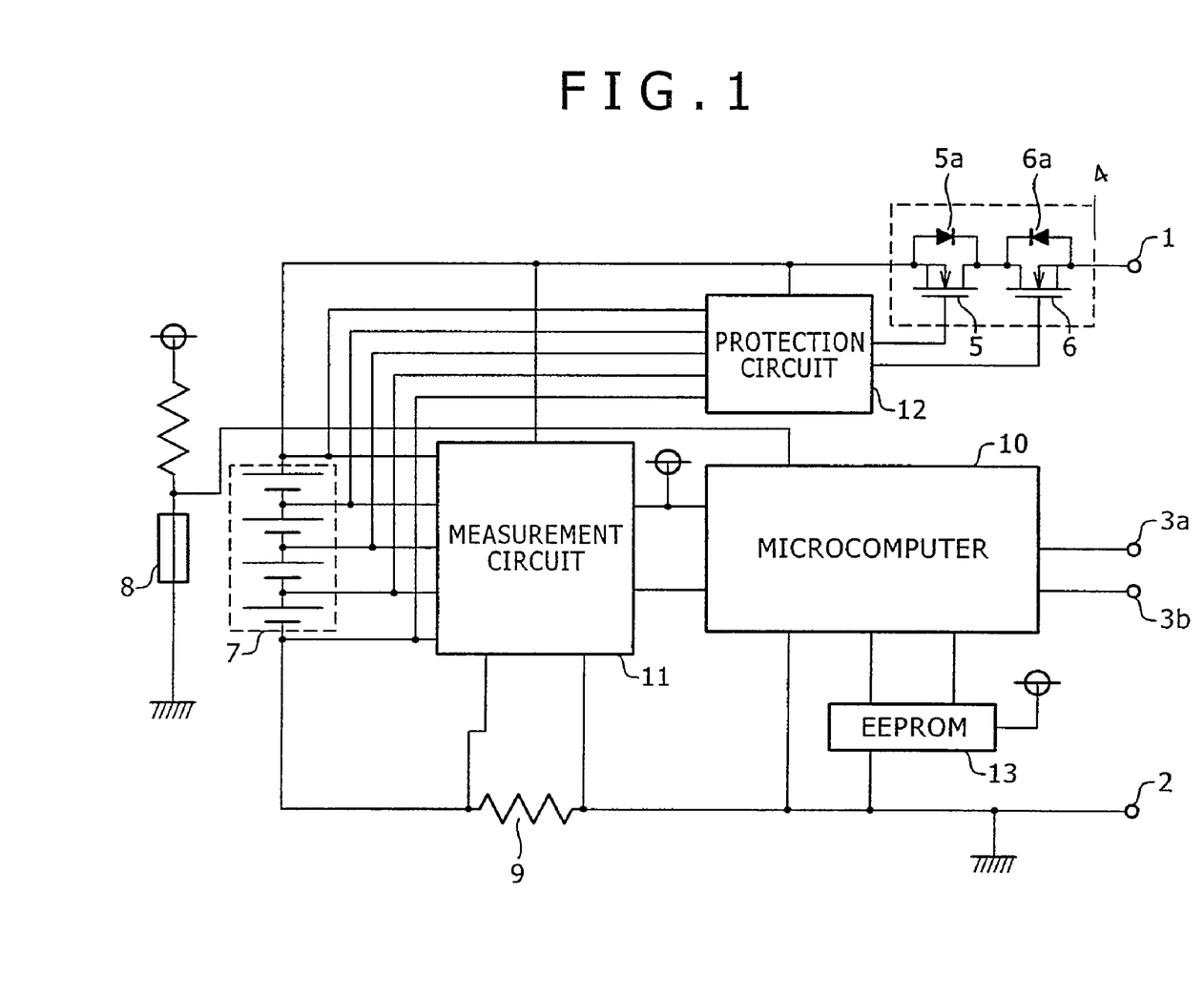
FIG. 1 is a schematic diagram showing an example of a structure of a battery pack to which a preferred embodiment of the present invention can be applied.

Hereafter, a preferred embodiment of the present invention will be described with reference to the drawings. Referring first to FIG. 1, an example of a battery pack using a secondary battery, a lithium ion battery, for example, will be described. A charger is equipped with this battery pack at time of charging. A + (positive) terminal 1 and a – (negative) terminal 2 are respectively connected to a + terminal and a – terminal of the charger, and charging is performed. Further, as with the time of charging, the + terminal 1 and the – terminal 2 are connected to a + terminal and a – terminal of an electrical device when using the electrical device, and discharge is performed.

The battery pack is mainly constituted by a battery cell 7, a microcomputer 10, a measurement circuit 11, a protection circuit 12, a switch circuit 4, and communications terminals 3a and 3b. The battery cells 7 are secondary batteries, such as a lithium ion battery, in which four secondary batteries are connected in series.

The microcomputer 10 is arranged to measure a current value and integrate the electric power by using a voltage value and the current value inputted from the measurement circuit 11. Further, a battery temperature is monitored with a temperature detection element (for example, a thermistor) as shown by reference numeral 8. Furthermore, the measured value and the like is saved in a nonvolatile memory EEPROM (Electrically Erasable and Programmable Read Only Memory) as shown by reference numeral 13.

The measurement circuit 11 measures a voltage of each cell of the battery cells 7 in the battery pack, and supplies measured value to the microcomputer 10. Further, a magnitude and a direction of current are measured using a current detection resister 9, and the measured value is sent to the microcomputer 10. The data of the measured temperature is supplied to the micro-converter 10. Furthermore, the measurement circuit 11 also has a function as a regulator to stabilize the voltage of the battery cells 7 and to generate a supply voltage.

The protection circuit 12 prevents overcharging and overdischarging by sending a control signal to the switch circuit 4, when the voltage of any one of the battery cells 7 becomes an overcharge detection voltage, or when the voltage of the battery cell 7 becomes an over-discharge detection voltage or less. Here, in the case of the lithium ion battery, the overcharge detection voltage is determined as 4.2 (V)±0.5 (V), and the over-discharge detection voltage is determined as 2.4 (V)±0.1 (V).

The switch circuit 4 is constituted by a charge control FET (Field Effect Transistor) as shown by reference numeral 5, and a discharge control FET as shown by reference numeral 6. When a battery voltage becomes an overcharge detection voltage, the charge control FET 5 is set to OFF, and it is controlled so that charge current does not flow. In addition, after tuning OFF the charge control FET 5, only the discharge can be attained through an internal diode as shown by reference numeral 5a.

Further, when the battery voltage becomes an over-discharge detection voltage, the discharge control FET 6 is set to OFF, and it is controlled so that the discharge current does not flow. In addition, after turning OFF the discharge control FET 6, only the charge can be attained through an internal diode as shown by reference numeral 6a.

The communications terminals 3a and 3b are for transmitting information on the battery capacity to the device, when connected to the electrical device, for example, a business-use camcorder. Receiving this information, the device side displays the charge capacity or a charging rate on a display unit, such as a liquid crystal display.

Figure 2:
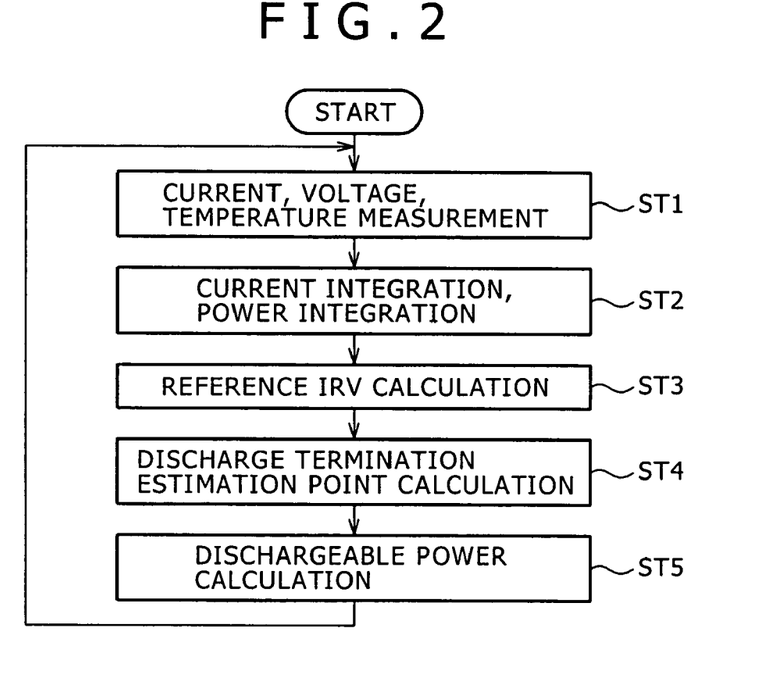
FIG. 2 is a flow chart for explaining a flow of processing of a preferred embodiment of a remaining capacity calculation method in accordance with a preferred embodiment of the present invention.

FIG. 2 is a flow chart schematically showing a flow of processing of the remaining capacity calculation method by way of the electric power integration method implemented in the microcomputer 10. The remaining capacity calculation is carried out in a situation where a load is connected thereto. The calculated remaining capacity, for example, a remaining capacity rate (%) is transmitted from the microcomputer 10 to the electric device through the communication terminals 3a and 3b, and it is displayed on the display unit of the electric device and the like, as needed.

In step ST1, the voltage value and the current value from the measurement circuit 11 are acquired. The voltage value and the current value are acquired at predetermined time interval, every 250 (ms), for example. In step ST2, the acquired current is integrated and it is held as an amount of the discharge current. Further, the electric power is calculated by way of the operation of voltage×current, the electric power is integrated, and it is held as discharge integration electric power.

In step ST2, the remaining capacity rate (%) is obtained from a ratio between an amount of integrated current and an amount of discharge current possessed by the battery. In other words, it is obtained by way of: remaining capacity rate=100−(amount of discharge current/full charge capacity)×100. By using a remaining capacity reference table showing a correspondence relationship between the voltage and the remaining capacity rate, a voltage (unloaded voltage) with respect to the calculated remaining capacity rate is obtained. The present measured discharge voltage is subtracted from the calculated unloaded voltage, and a difference between them is calculated as IRV (voltage fall due to the discharge current).

Furthermore, in step ST3, by using a DC-Imp table showing a correspondence relationship between a DC-Imp factor and the remaining capacity rate, and the DC-Imp factor with respect to the calculated remaining capacity rate is obtained. The DC-Imp factor is a value corresponding to an internal direct-current impedance value of the battery cell 7. A reference IRV is calculated by dividing the calculated IRV by the DC-Imp factor.

Figure 3:
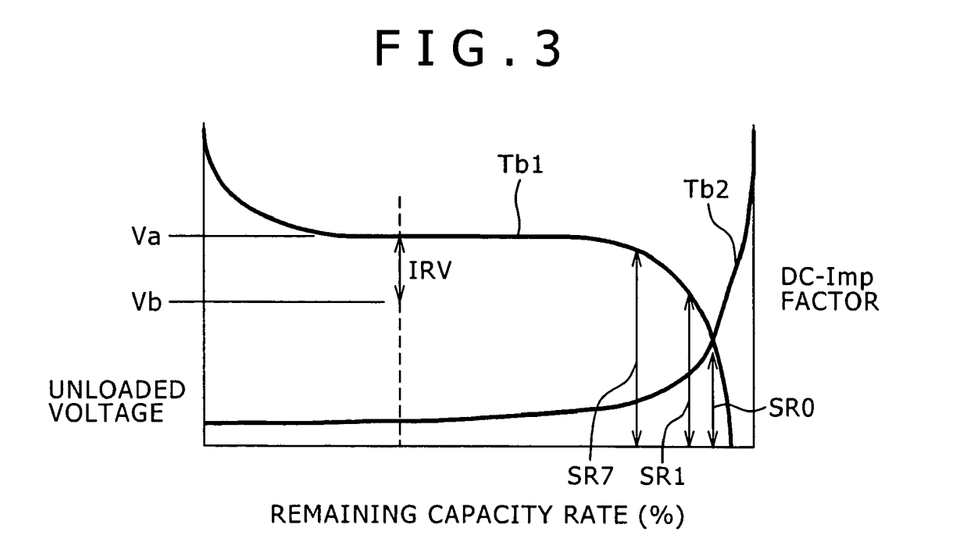
FIG. 3 is a graph for explaining an example of a remaining capacity reference table and a DC-Imp reference table which are used according to a preferred embodiment of the present invention.

FIG. 3 shows a table to be used as a graph. In FIG. 3, a horizontal axis (abscissa-axis) is the remaining capacity rate (%), and vertical axes (ordinate-axis) indicate the unloaded voltage and the DC-Imp factor. A reference sign Tb1 shows a graph of the remaining capacity reference table, and a reference sign Tb2 shows a graph of a DC-Imp reference table. These tables are created in advance according to the battery pack to be used, and are stored in a memory of the microcomputer 10.

In step ST3, as shown in FIG. 3, an unloaded voltage Va and a present discharge voltage Vb with respect to a certain remaining capacity rate are found, and a difference between them is obtained as IRV.

A discharge termination estimation point is calculated in step ST4. In step ST4, an estimated discharge voltage is calculated by way of "estimated discharge voltage=remaining capacity reference table voltage (unloaded voltage)−reference IRV×DC-Imp factor". The unloaded voltage and the DC-Imp factor are found for every % (+) from 0% of the remaining capacity rate until the conditions of "discharge termination voltage≦estimated discharge voltage" are fulfilled, and the remaining capacity rate whose conditions are met is calculated. The thus found remaining capacity rate expresses the discharge termination estimation point of the amount of discharge current possessed by the battery, that is:

amount of discharge current possessed by battery× remaining capacity rate=amount of dischargeable current.

Figure 4:
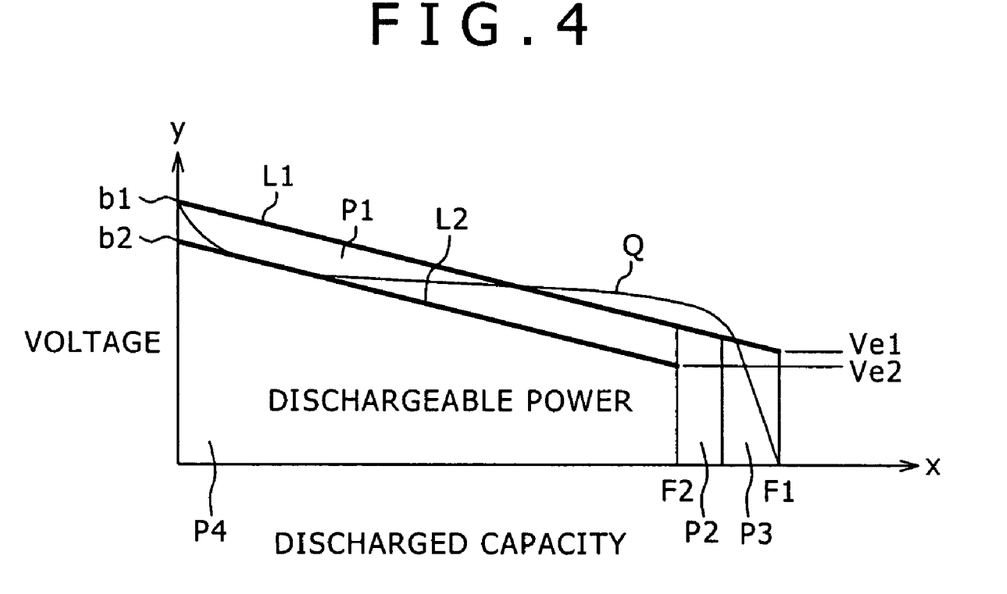
FIG. 4 is a graph used for explaining calculation of dischargeable electric power.

Next, a dischargeable electric power is calculated in step ST5. As shown in FIG. 4, let the abscissa-axis express the discharge capacity and the ordinate-axis express the voltage, a curve Q of discharge voltage change from a full charge of the secondary battery (battery cell 7) to the discharge termination is approximated as a straight line (linear line) L1 of y=−ax+b1. Here, the slope (a constant) is a value calculated based on the data of the discharge curve of the secondary battery. "a" becomes a value according to the battery pack to be used.

An intercept b1 takes a predetermined voltage value (nominal voltage value) under an unloaded condition when in full charge. A value of b1 is referred to as a load factor and the value changes depending on the conditions of the temperature and the load. The load factor becomes a value lower than the nominal voltage value according to the value of the discharge current and the temperature, and the load factor is obtained from the discharge current and the conditions of the temperature.

A table of a temperature factor is created in advance which takes a small value as the temperature rises. A product value by multiplying a square root of the temperature factor and the discharge current with a predetermined number is subtracted from the nominal voltage value, and the load factor is obtained. For example, even if the nominal voltage value b1 is 16800 (mV), it falls like b2=16496 (mV). Therefore, if the temperature decreases, a straight line L1 moves downwards, and the dischargeable electric power decreases further. If the discharge current increases, the straight line L1 moves downwards likewise. Furthermore, a discharge termination voltage Ve1 is obtained by substituting a discharge termination capacity F1 for x. The discharge termination capacity F1 takes a predetermined value according to the battery pack.

Therefore, a portion which is surrounded by the straight line L1 and a line extending from the discharge termination voltage Ve1 of the straight line L1 perpendicularly to a point F1 represents a theoretically dischargeable electric power at time of no-load. With a load, there is an invalid capacity which is not available for use because of the load and temperature conditions, and capacity reduction caused by degradation of the secondary battery.

In other words, electric power P1 which is not available for use because of heat generated by polarization due to load current, electric power P2 which is not available for use under the load or the environmental conditions, and the electric power P3 which is not available for use because of the degradation of the battery are subtracted from the theoretically dischargeable electric power, whereby practical dischargeable electric power P4 when the load is connected is calculated. Since there is remaining capacity, the electric power P2 can be used as a battery, and therefore is different from other electric power P1 and P3.

A ratio between the dischargeable electric power P4 calculated here and the electric power integrated at predetermined time interval is calculated, and the remaining capacity rate of the whole battery can be obtained.

It is necessary to find the dischargeable electric power P4 with a high degree of accuracy in order to increase the accuracy of the calculation of the remaining capacity rate. According to a preferred embodiment of the present invention, it is calculated in such a way that the capacity which is not available because of the above-mentioned load and temperature conditions, and the capacity reduction due to the degradation of the secondary battery moves the discharge termination capacity in the minus direction (towards the origin) on the abscissa-axis. F2 is the thus found discharge termination capacity.

As will be described later, the discharge termination estimation point is obtained and it is obtained by a dischargeable capacity rate (POSI RATE)=100 (%)−discharge termination estimation point (%). The discharge termination capacity (CAPA END) as shown by F2 is obtained by the following formula:

discharge termination capacity (CAPA END)=dischargeable capacity rate (POSI RATE)×full charge capacity A voltage Ve2 at time of discharge termination capacity (discharge termination voltage) is calculated by the following formula:

discharge termination voltage Ve2=−a×discharge termination capacity+b2

By way of the above process, it is possible to find a straight line L2 which is arranged by translating the straight line L1 in parallel. The straight line L2 is a straight line for obtaining the dischargeable electric power when the load is connected.

The above-mentioned remaining capacity calculation process is performed by the software of the microcomputer 10 in such a way that each time the measured value of current, voltage or temperature, for example, is inputted at predetermined time interval, the microcomputer 10 is interrupted.

Figure 5:
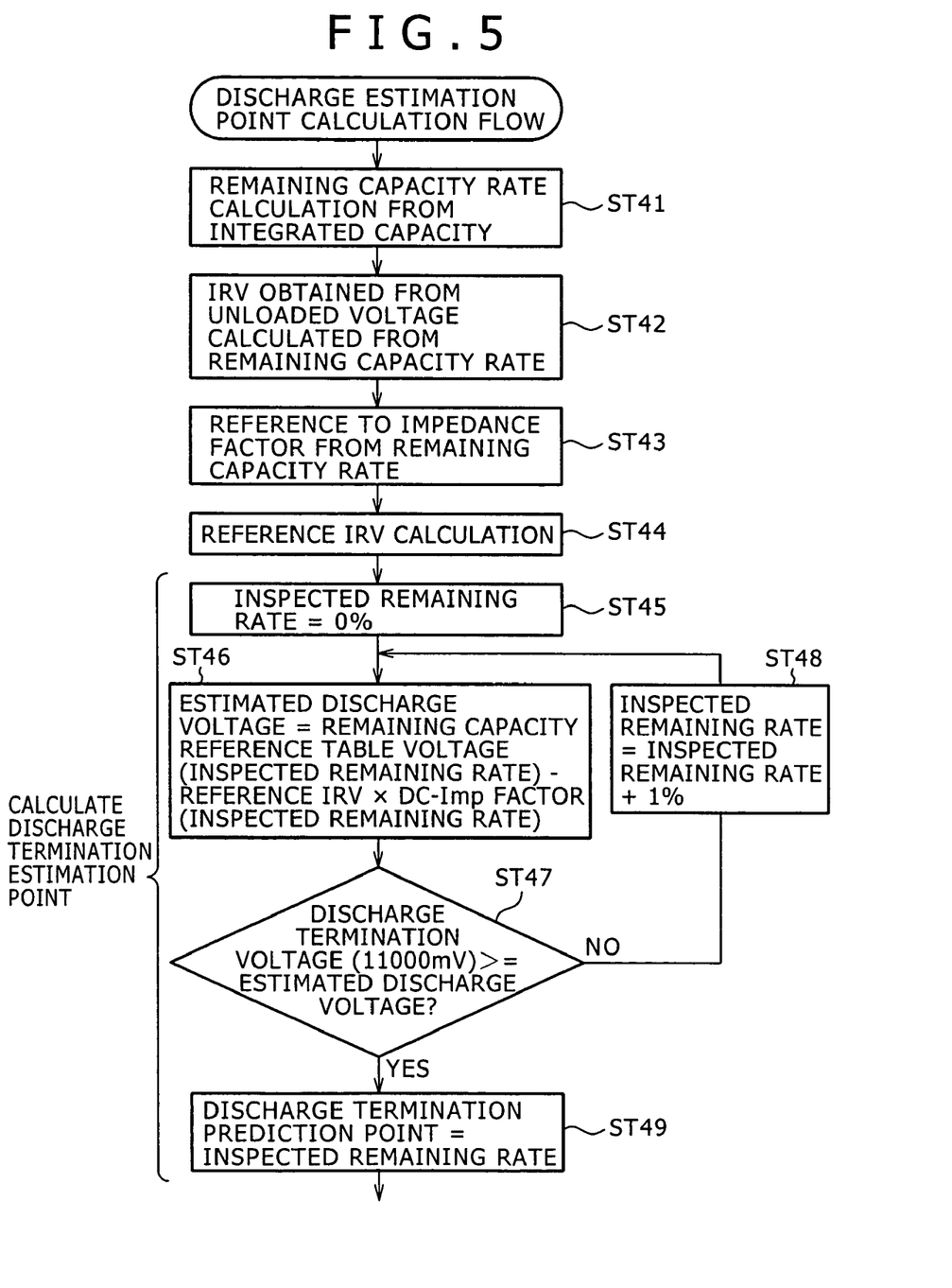
FIG. 5 is a flow chart showing a flow of processing for obtaining a discharge termination estimation point.

In the preferred embodiment of a preferred embodiment of the present invention as described above, reference IRV calculation (step ST3) and a calculation process (step ST4) of the discharge termination estimation point will be described in detail. In a flow chart as shown in FIG. 5, the present remaining capacity rate is calculated in step ST41 from the result of having performed an integration process at predetermined time interval, for example every 250 (ms).

A particular example will be described. Let the amount of discharge current found from the current integrated value be 1341 (mAh) and the full charge capacity be 4400 (mAh), the remaining capacity rate is obtained by the following formula:

$$\begin{aligned}\frac{\text{remaining}}{\text{capacity rate}} &= 100 - \left(\frac{\text{amount of discharge current}}{\text{full charge capacity}}\right) \times 100 \\ &= 100 - (1341/4400) \times 100 \\ &= 69.52\%\end{aligned}$$

In step ST42, the unloaded voltage at that time (Va in FIG. 3) is calculated from the found remaining capacity rate, and the IRV (voltage fall due to discharge current) is obtained. In other words, the remaining capacity rate is referenced from the remaining capacity reference table, and the unloaded voltage Va at that time is acquired. Then the IRV is calculated by subtracting the measured present discharge voltage (Vb in FIG. 3) from the voltage.

For example, when remaining capacity rate=69.92%, and when the present discharge voltage Vb is 14626 (mV), by rounding off a value below a decimal point, the unloaded voltage Va at time of 69% can be found as 15615 (mV) from the remaining capacity reference table. The unloaded voltage when 69%+1%=70% can be found as 15637 (mV) from the table.

By way of linear interpolation of the following formula, a voltage for 0.52% is obtained, and added to the voltage at time of 69%, and a voltage at time of the remaining capacity rate of 69.52% is calculated.

$$\begin{aligned}
\text{voltage rise} &= \frac{\begin{array}{c}(\text{unloaded voltage at 70\%} - \\ \text{unloaded voltage at 69\%})\end{array}}{\begin{array}{c}(100/\text{remaining capacity rate} \\ \text{below decimal point})\end{array}} \\
&= (15637 - 15615)/(100/52) \\
&= 11 \text{ (mV)}
\end{aligned}$$

$$\begin{aligned}
\text{unloaded voltage at time of } 69.52\% &= 15615 \text{ (mV)} + 11 \text{ (mV)} \\
&= 15626 \text{ (mV)}
\end{aligned}$$

$$\begin{aligned}
IRV &= \text{unloaded voltage} - \text{present discharge voltage} \\
&= 15626 \text{ (mV)} - 14626 \text{ (mV)} \\
&= 1000
\end{aligned}$$

In step ST43, an impedance factor at that time is referenced from the remaining capacity rate. With reference to the DC-Imp reference table, the DC-Imp factor corresponding to the remaining capacity rate is obtained. When searching from the DC-Imp reference table, the value below the decimal point of the remaining capacity rate is rounded off. As an example, in the case where the remaining capacity rate is 69.52%, the value below the decimal point is rounded off, and at 69% it is obtained as DC-Imp factor=1.00 with reference to the DC-Imp reference table.

The reference IRV is calculated in step ST44. The reference IRV is obtained from the previously calculated IRV and DC-Imp factor.

reference IRV=IRV/DC-Imp factor

Let the IRV: 1000 and DC-Imp factor: 1, for example, then it is obtained as reference IRV=1000/1=1000 (mV).

The discharge termination estimation point is calculated in step ST46 et seq.

estimated discharge voltage=remaining capacity reference table voltage−reference IRV×DC-Imp factor By way of this formula, it is calculated for every +1% of the remaining capacity rate from 0%, and a discharge termination point is inspected. And the search is carried out until the estimated discharge voltage is brought into agreement with the following formula:

discharge termination voltage≦estimated discharge voltage

As an example, let reference IRV: 1000 and discharge termination voltage: 11000 (mV). Further, as shown in FIG. 3, a search SR0 at time of the remaining capacity rate of 0%, a search SR1 at time of the remaining capacity rate of 1%, . . . , and a search SR7 at time of the remaining capacity rate of 7% are made in order.

In step ST45, inspected remaining capacity rate=0% is set up. In step ST46, estimated discharge voltage=remaining capacity reference table voltage (0%): 11000 (mV)−reference IRV: 1000×DC-Imp factor: 25.11=−14000 (mV) are found.

In step ST47, it is determined whether or not (discharge termination voltage: 11000 (mV)≦estimated discharge voltage: −14000 (mV)) is acceptable. In this case, since it is not acceptable, it is determined that 0% is not the discharge termination point. The process moves to step ST48 and the inspected remaining capacity rate is rendered as +1%. Again, steps ST46 and ST47 are repeated.

In step ST46, estimated discharge voltage=remaining capacity reference table voltage (1%): 12427 (mV)−reference IRV: 1000×DC-Imp factor: 17.29=−4863 (mV) are found.

In step ST47, it is determined whether or not (discharge termination voltage: 11000 (mV)≦estimated discharge voltage: −4863 (mV)) is acceptable. In this case, since it is not acceptable, it is determined that 1% is not the discharge termination point. The process moves to step ST48 and the inspected remaining capacity rate is rendered as +2%. Again, steps ST46 and ST47 are repeated.

If the inspected remaining capacity rate is increased to 3%, 4%, . . . , and the inspected remaining capacity rate becomes 7%, then in step ST46, estimated discharge voltage=remaining capacity reference table voltage (7%): 14416 (mV)−reference IRV: 1000×DC-Imp factor: 3.33=11086 (mV) are found.

In step ST47, it is determined whether or not (discharge termination voltage: 11000 (mV)≦estimated discharge voltage: 11086 (mV)) is acceptable. Since it is acceptable in this case, the process moves to step ST49. In step ST49, the discharge termination estimation point is determined to be the inspected remaining capacity rate (7%).

The dischargeable capacity rate (POSI RATE) is calculated from the discharge termination estimation point. For example, when the discharge termination estimation point is 7%, $$\begin{aligned}
POSI \text{ RATE} &= 100\% - \text{discharge termination estimation point} \\
&= 100\% - 7\% \\
&= 93\%
\end{aligned}$$

are calculated.

The discharge termination capacity (CAPA END) is calculated from the dischargeable capacity rate (POSI RATE). In FIG. 4, F2 is the discharge termination capacity.

discharge termination capacity (CAPA END)=dischargeable capacity rate (POSI RATE)×full charge capacity For example, in the case of dischargeable capacity rate (POSI RATE): 93%, and full charge capacity: 4400 (mAh), it is obtained as:

discharge termination capacity (CAPA END)=0.93× 4400=4092 (mAh)

In FIG. 4, when the actual discharge termination capacity is known, the dischargeable electric power can be found correctly. Therefore, by obtaining a rate of a discharged electric power integrated value from the dischargeable electric power according to the environmental conditions, such as the load and the temperature, the remaining capacity rate can be detected.

When the charge capacity is calculated by way of the integration method, if it is accompanied by a division process, then the value below the decimal point in the data is rounded off by truncation and the like and the truncated value (current value) is integrated. Thus an error is accumulated in the integration product. As a result, the accuracy of the integrated current value is impaired and the accuracy of detection of a charging rate is also impaired.

In order to prevent the error from accumulating, a method of increasing the number of significant digits to cope with the error due to the truncation increases the amount of memory used of the microcomputer contrarily, which may impose the process. Further, when the memory of the microcomputer is insufficient, the number of significant digits cannot be increased, but the truncated data will be integrated, which leads to impair the accuracy.

Then, in order to lessen influence of the truncation as much as possible, the following integration method is used according to a preferred embodiment of the present invention.

At time of measurement of the current value, an amplifier providing a gain of 24 times and an amplifier providing a gain of 125 times are used for supplying an output voltage of each amplifier to an A/D converter of the microcomputer 10, to convert it into digitized data. Each amplifier is properly used according to the current value. When the current is larger than, for example, 2(A), the 24 times amplifier is used. The 125 times amplifier is used when it is 2(A) or lower. With this structure, it is possible to lessen the difference in the number of significant digits between a small current value and a large one.

However, since a weight of the digit is different between the measured value through the 24 times amplifier and the measured value through the 125 times amplifier, the values cannot simply be added together. Then, the influence of the truncation is reduced by the following method:

For example, hardware conditions of current measurement are made as follows:

A/D reference voltage (AVREF): 3000 (mV)
A/D resolution: 1024 (10 Bit)
Current detection resister (resister 9 of FIG. 1):
5 (m$\Omega$)

At this event, the voltage value inputted into the A/D converter, per current 1(A) which flows through the battery cell 7 is:

In the case of 24 times amplifier:

$$5 \ (m\Omega) \times 1(A) \times 24 = 120 \ (mV/A) \quad (1)$$

In the case of 125 times amplifier:

$$5 \ (m\Omega) \times 1(A) \times 125 = 625 \ (mV/A) \quad (2)$$

Further, voltage sensitivity per 1 resolution of the A/D converter becomes 3000 (mV)/1024=2.930 (mV). If this is converted into a current sensitivity when using the 24 times amplifier, it is given as:

$$2.930 \ (mV)/120 \ (mV/A) \times 1000 \approx 24.41 \ (mA).$$

Figure 6:
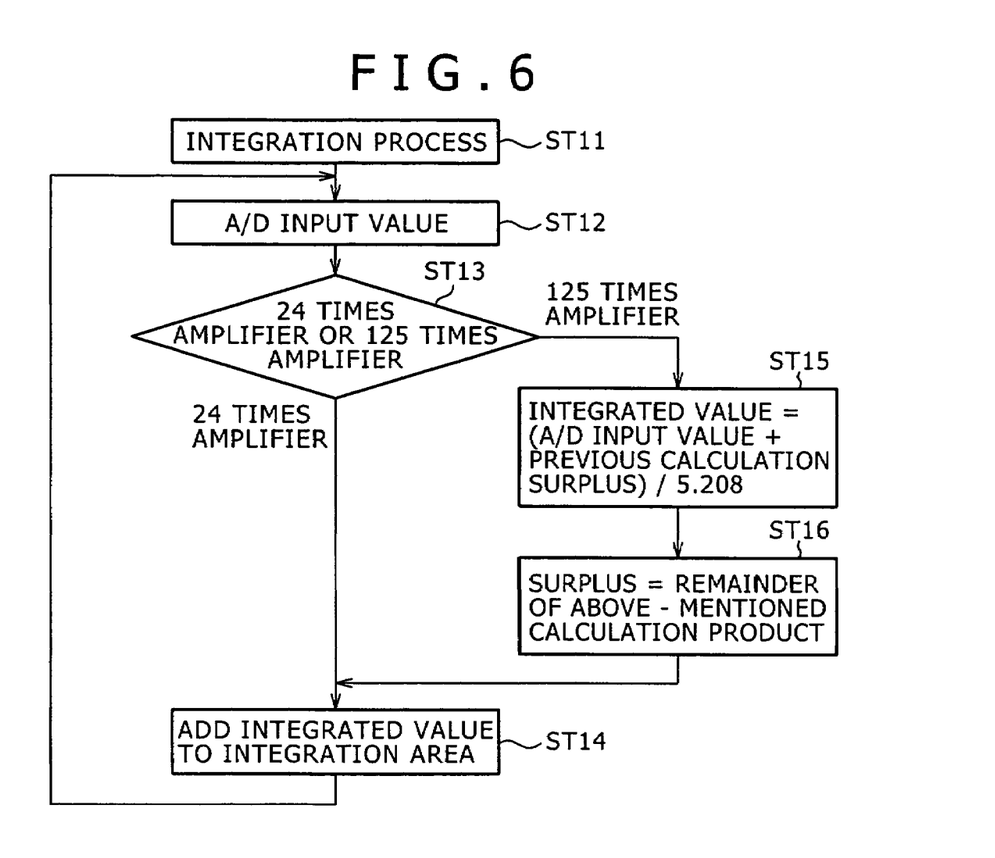
FIG. 6 is a flow chart for explaining an integration process.

Based on the above-mentioned values, a flow of the integration process will be described with reference to a flow chart of FIG. 6.

Firstly, when the integration process is started in step ST11, the current value inputted into the A/D converter is measured by the current detection resister 9 in FIG. 1. The measured current value is supplied to the microcomputer 10 as an A/D input value (step ST12). Next, in step ST13, it is determined whether to use the 24 times amplifier or the 125 times amplifier to measure the input value calculated in step ST12. When the current value in the current detection resister 9 is larger than 2(A), the 24 times amplifier is used, and the 125 times amplifier is used when it is 2(A) or lower.

When using the 24 times amplifier, an A/D input voltage is calculated from the above-mentioned formula (1). For example, when the discharge current is 2.5(A), the A/D input voltage is:

$$120 \ (mV/A) \times 2.5 \ (A) = 300 \ (mV).$$

Further, when the A/D input voltage is converted into digitized data, the input value (integrated value) after A/D conversion is:

$$300 \ (mV)/2.930 \ (mV) \approx 102.$$

When the 24 times amplifier is used, the found integrated value is added to an integration area as it is.

When using the 125 times amplifier, the A/D input voltage is calculated from the above-mentioned formula (2). For example, when the discharge current is 0.8(A), the A/D input voltage is:

$$625 \ (mV/A) \times 0.8(A) = 500 \ (mV).$$

Further, the input value (BATT_CURRENT_BIT) after the A/D conversion is:

$$300 \ (mV)/2.930 \ (mV) \approx 170.$$

When the 125 times amplifier is used, the conversion is carried out so that the weight of digit may be similar to when using the 24 times amplifier in step ST15, then the integration is performed (the previous surplus is set to 0 for the first integration). Converting the input value 170 after the A/D conversion into that at time of using the 24 times amplifier, gives 170/5.208=32 and surplus 3.344. By truncating below the decimal point of the surplus in step ST16, it is obtained that the integrated value is 32 and the surplus is 3, and 32 is added to the integration area.

Figure 7:
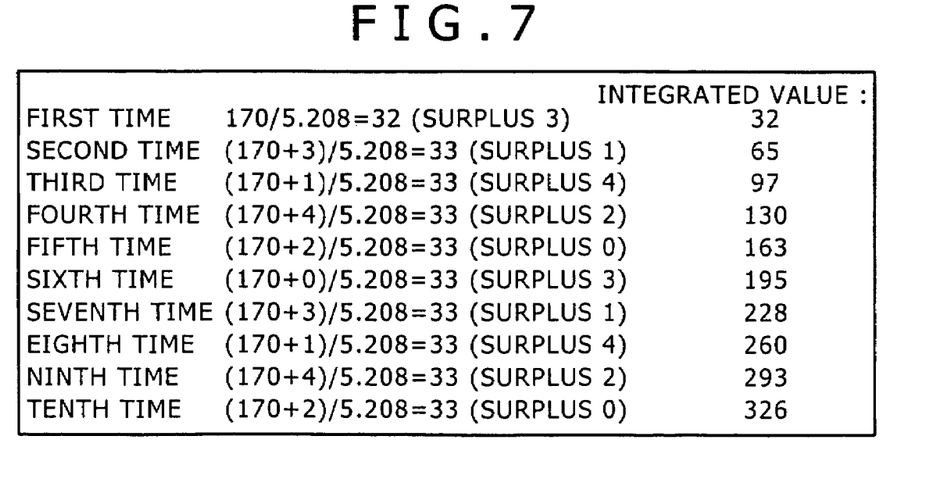
FIG. 7 is a chart showing an example of data integration at time of using an integration method of performing surplus addition.

Now, an example will be described where the integration is carried out 10 times while the discharge current is 0.8 (A). When the surplus is disregarded and the surplus addition is not carried out, the integrated value is: 32×10 (times)=320. However, if it is calculated by using the input value 170 before the conversion, then it is theoretically: {170×10 (times)}/5.208≈326, and a difference of 6 arises in the integrated value.

Then, the surplus found at time of the previous division is added when the next calculation is carried out to perform the integration process. In other words, the first surplus 3 is added to the input value 170 before the conversion which is obtained in the second time, and the second integrated value is determined by converting a sum total value. In the third time et seq., similar to the second time, after adding the previous surplus to the input value before conversion, the whole is converted.

The situation of the integration process up to the tenth time is shown in FIG. 7. As a result of performing the integration process by way of the method of adding the surplus, in this example, the value of the integration area becomes 326 and an error does not occur. Therefore, the influence of the truncation can be reduced as much as possible by performing the division, after adding the surplus at time of the previous calculation to the A/D input value.

Further, since it is not necessary to increase the number of significant digits, the memory used in the microcomputer 10 can be minimized.

Although the preferred embodiments of the present invention are particularly described above, the present invention is not limited to the above-mentioned preferred embodiments. It will be obvious to those skilled in the art that various changes, modifications, combinations, sub combinations and alterations may be made depending on design requirements and other factors insofar as they are within the scope of the appended claims or equivalents thereof.

For example, in an electric device, the remaining capacity may be shown by another way, such as available remaining time, other than the remaining capacity rate. Further, the values as exemplified in the above-mentioned preferred embodiments are described by way of example only, but a value different from these may be used as needed.

Further, the present invention is applicable to various batteries, such as a Ni—Cd (nickel-cadmium) battery and a Ni—MH (nickel hydrogen) battery besides a lithium ion battery. Furthermore, a microcomputer which constitutes the battery pack may have a function of the protection circuit.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A battery pack of a secondary battery, comprising a measurement unit for measuring voltage and current of the secondary battery, and a remaining capacity calculation unit; wherein the remaining capacity calculation unit measures the voltage and current when using the secondary battery at preset time interval, and integrates the used electric power by way of integration of the voltage and the current; calculates an available dischargeable electric power by subtracting an energy loss and unavailable energy from a discharge electric power of the secondary battery; and calculates a remaining capacity rate from a ratio between the integrated electric power and the dischargeable electric power, wherein the dischargeable electric power is calculated as an area based on an intersection of a first straight line and an intersection of a second straight line, an abscissa-axis and an ordinate-axis, where the first straight line is a line obtained by approximation of discharge voltage associated with no load to a first termination of discharge value of the secondary battery and the second straight line is a line obtained by the calculation of discharge voltage associated with a load to a second termination of discharge value of the secondary battery, and wherein the abscissa-axis represents discharge capacity and the ordinate-axis represents voltage, wherein a table of correspondence relationship between the remaining capacity rate and a DC impedance factor is prepared, and a discharge termination voltage in a discharge termination section is obtained taking into consideration an increase in the DC impedance, wherein the unavailable energy comprises a first electric power unavailable for use because of heat generated by polarization due to load current, a second electric power unavailable for use because of the load or the environmental conditions, and a third electric power unavailable for use because of the degradation of the battery.

* * * * *